United States Patent
Aoyama et al.

(10) Patent No.: US 9,741,576 B2
(45) Date of Patent: Aug. 22, 2017

(54) LIGHT IRRADIATION TYPE HEAT TREATMENT METHOD AND HEAT TREATMENT APPARATUS

(71) Applicant: SCREEN Holdings Co., Ltd., Kyoto (JP)

(72) Inventors: Takayuki Aoyama, Kyoto (JP); Hikaru Kawarazaki, Kyoto (JP); Masashi Furukawa, Kyoto (JP); Kazuhiko Fuse, Kyoto (JP); Hideaki Tanimura, Kyoto (JP); Shinichi Kato, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 15/242,709

(22) Filed: Aug. 22, 2016

(65) Prior Publication Data
US 2017/0062223 A1     Mar. 2, 2017

(30) Foreign Application Priority Data

Aug. 26, 2015    (JP) ................................ 2015-166512
May 24, 2016    (JP) ................................ 2016-103567

(51) Int. Cl.
*H01L 21/285*     (2006.01)
*H01L 21/67*     (2006.01)
(Continued)

(52) U.S. Cl.
CPC ...... *H01L 21/28518* (2013.01); *H01L 21/265* (2013.01); *H01L 21/268* (2013.01); *H01L 21/67115* (2013.01); *H01L 21/67248* (2013.01)

(58) Field of Classification Search
CPC combination set(s) only.
See application file for complete search history.

(56) References Cited

U.S. PATENT DOCUMENTS 7,327,947 B2    2/2008  Kusuda .................. 392/416
8,852,966 B2    10/2014 Kiyama et al. .......... 438/14
(Continued)

FOREIGN PATENT DOCUMENTS

JP    2013-069990    4/2013
JP    2013-084901    5/2013
(Continued)

OTHER PUBLICATIONS

Taiwanese Office Action (Application No. 105123475) dated Mar. 10, 2017 and its partial English translation.

*Primary Examiner* — Kyoung Lee
*Assistant Examiner* — Ratisha Mehta
(74) *Attorney, Agent, or Firm* — Ostrolenk Faber LLP

(57) ABSTRACT

A metal film is deposited on a front surface of a semiconductor wafer of silicon. After the semiconductor wafer is received in a chamber, the pressure in the chamber is reduced to a pressure lower than atmospheric pressure. Thereafter, nitrogen gas is supplied into the chamber to return the pressure in the chamber to ordinary pressure, and the front surface of the semiconductor wafer is irradiated with a flash of light, so that a silicide that is a compound of the metal film and silicon is formed. The oxygen concentration in the chamber is significantly lowered during the formation of the silicide because the pressure in the chamber is reduced once to the pressure lower than atmospheric pressure and then returned to the ordinary pressure. This suppresses the increase in resistance of the silicide resulting from the entry of oxygen in the atmosphere in the chamber into defects near the interface between the metal film and a base material.

8 Claims, 13 Drawing Sheets

(51) Int. Cl.
*H01L 21/268* (2006.01)
*H01L 21/265* (2006.01)

(56) References Cited

U.S. PATENT DOCUMENTS

| | | | |
|---|---|---|---|
| 2003/0089132 A1* | 5/2003 | Kusuda | H01L 21/67115 65/29.18 |
| 2012/0244725 A1 | 9/2012 | Fuse et al. | 438/799 |
| 2013/0026152 A1* | 1/2013 | Suzuki | H01L 21/02197 219/243 |
| 2013/0078744 A1 | 3/2013 | Kiyama et al. | 438/5 |
| 2013/0078802 A1 | 3/2013 | Fuse et al. | 438/660 |
| 2013/0203269 A1 | 8/2013 | Yokouchi | 438/795 |
| 2013/0206747 A1 | 8/2013 | Nishide | 219/538 |
| 2016/0247692 A1 | 8/2016 | Fuse et al. | H01L 21/324 |
| 2016/0293424 A1 | 10/2016 | Fuse et al. | H01L 21/2253 |

FOREIGN PATENT DOCUMENTS

| | | |
|---|---|---|
| JP | 2013-207152 | 10/2013 |
| TW | 201243954 | 11/2012 |
| TW | 201316413 | 4/2013 |

* cited by examiner

F I G . 3
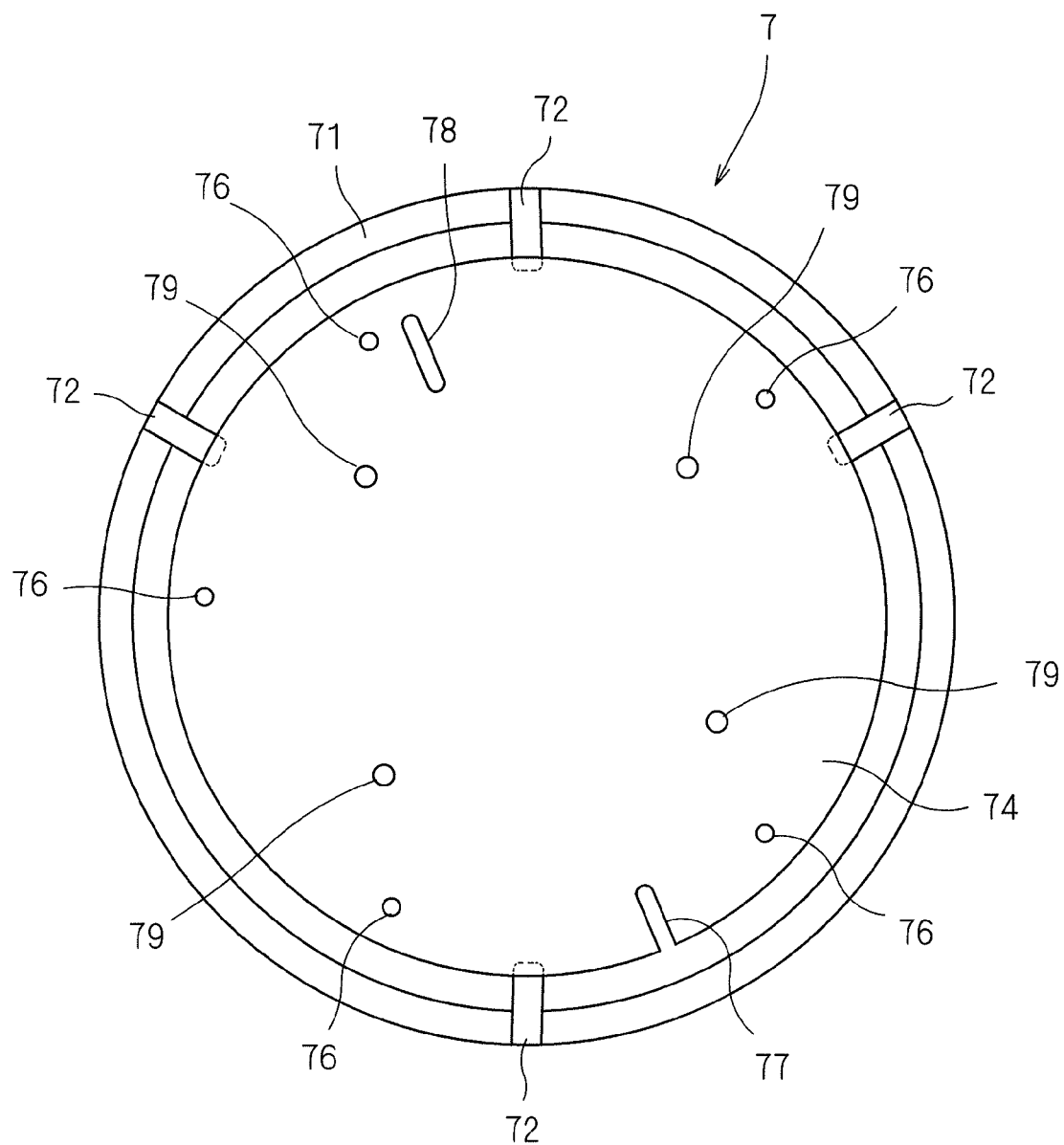

F I G . 4
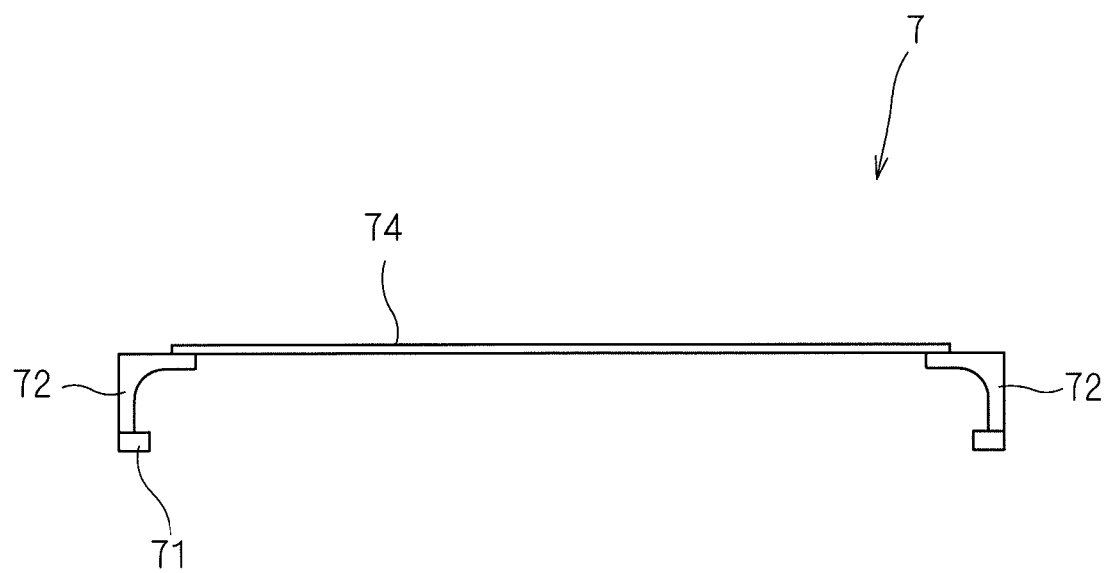

F I G . 6
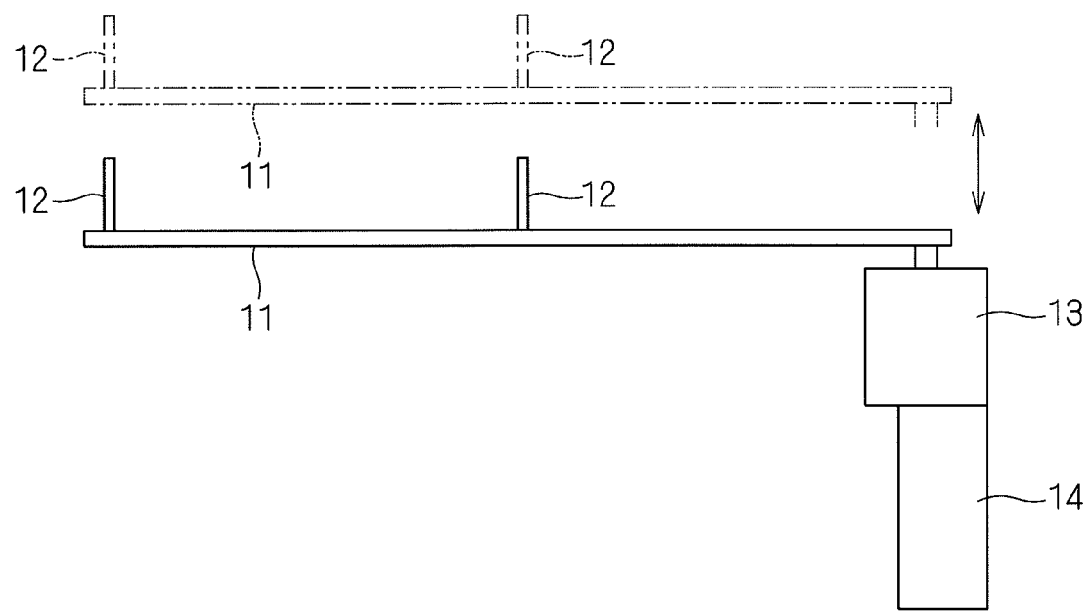

F I G. 7
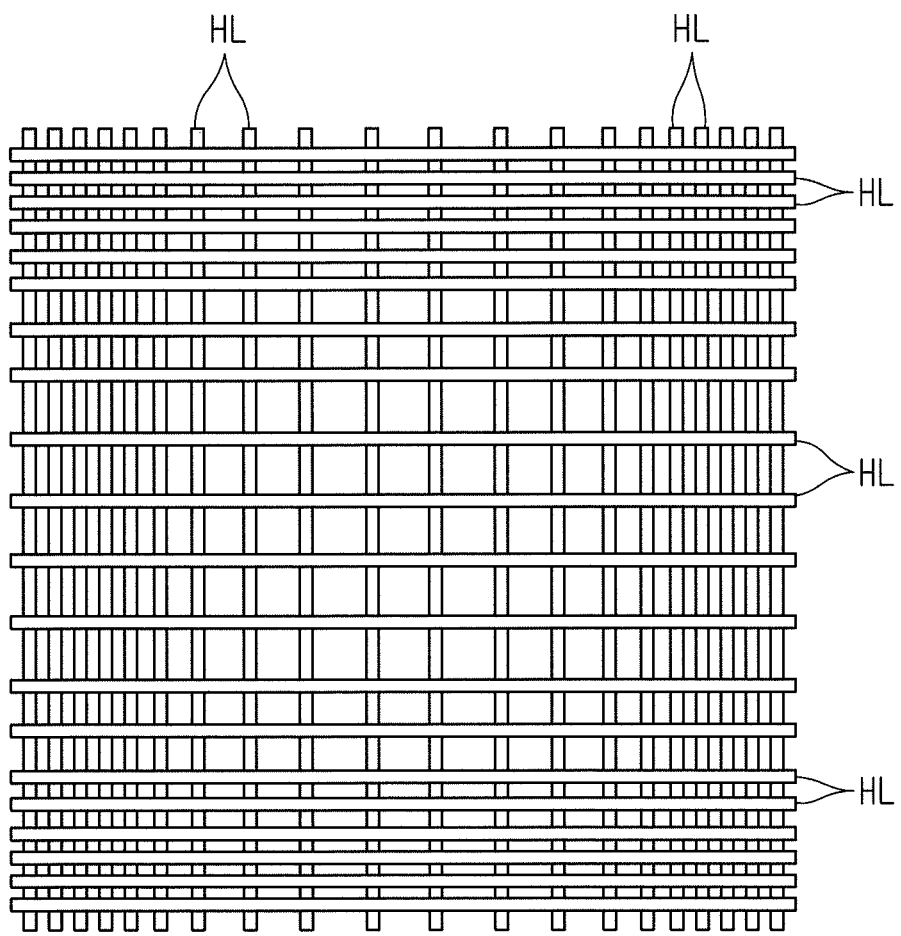

F I G . 8
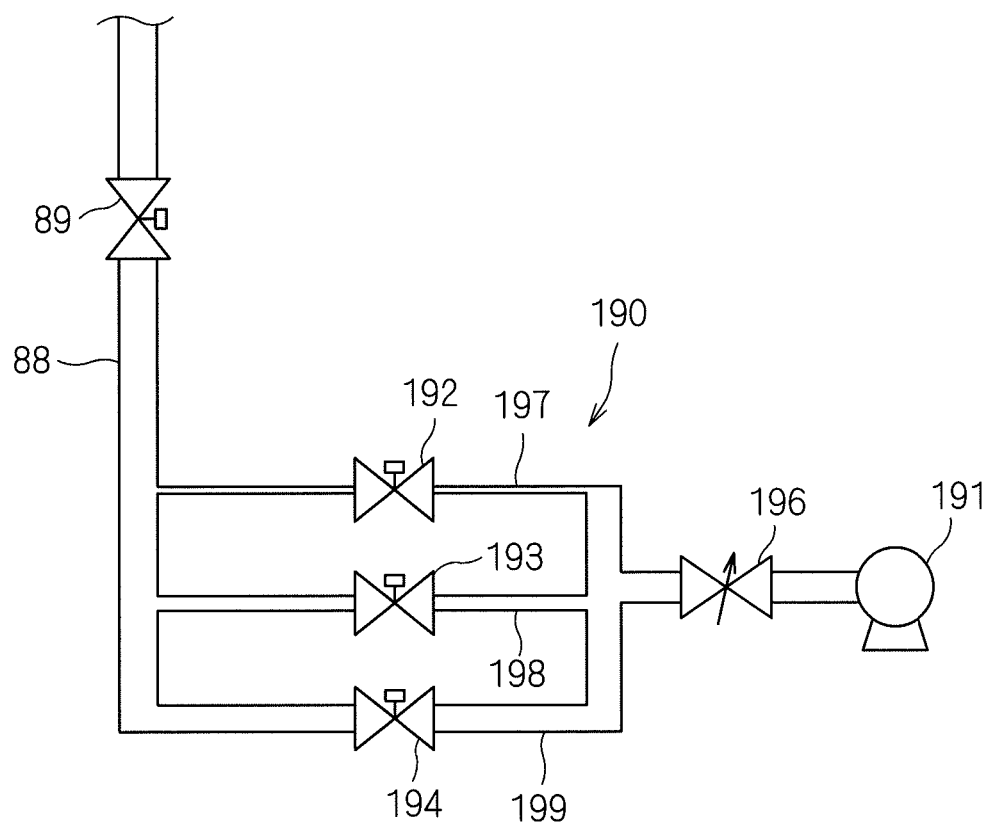

F I G. 1 1
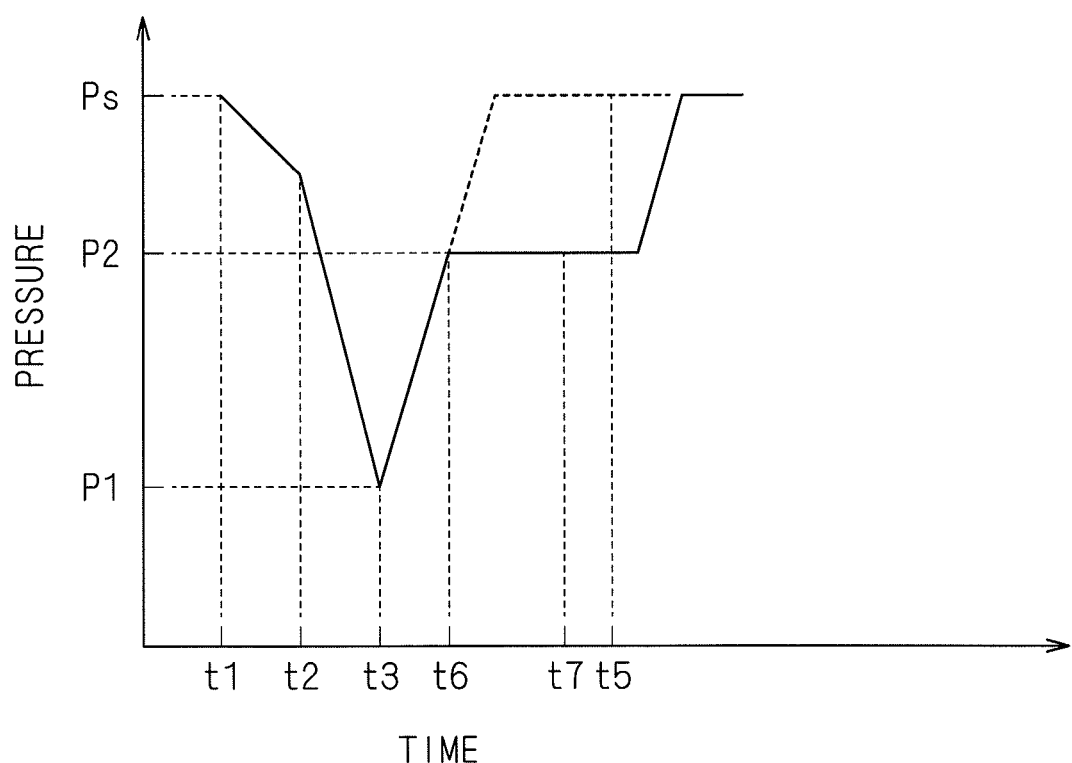

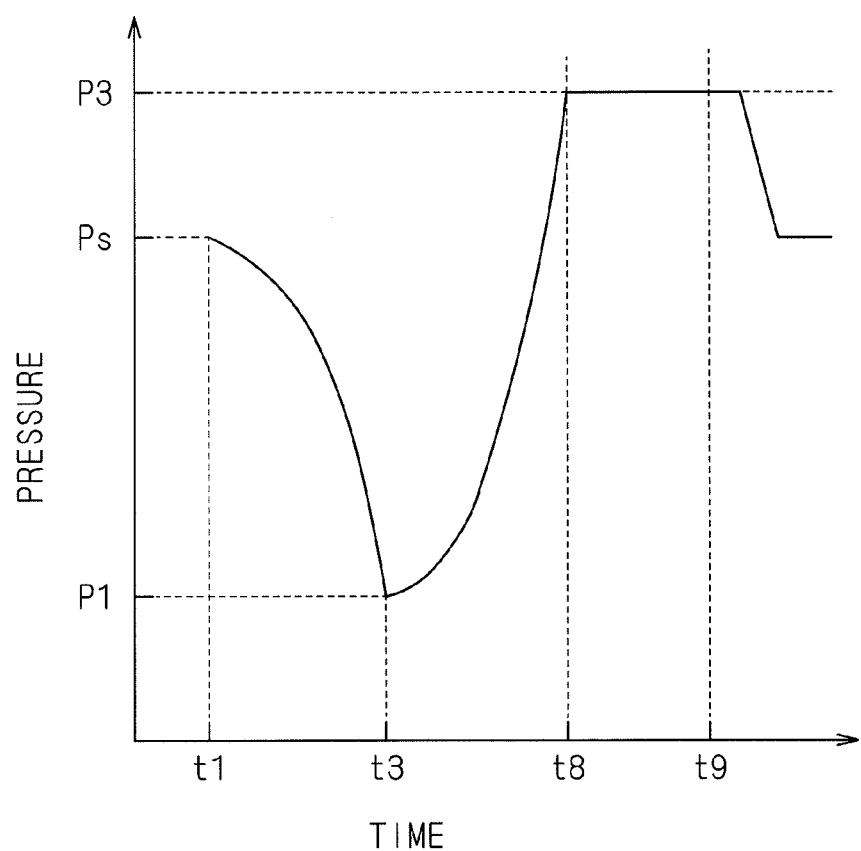

__LIGHT IRRADIATION TYPE HEAT TREATMENT METHOD AND HEAT TREATMENT APPARATUS__

BACKGROUND OF THE INVENTION

Field of the Invention

The present invention relates to a heat treatment method and a heat treatment apparatus which irradiate a thin plate-like precision electronic substrate (hereinafter referred to simply as a "substrate") of silicon or silicon-germanium such as a semiconductor wafer with a flash of light to form a silicide or a germanide.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, for example, typically for the activation of impurities implanted in a semiconductor wafer. The irradiation of a surface of a semiconductor wafer implanted with impurities by an ion implantation process with a flash of light from flash lamps allows the temperature rise to an activation temperature only in the surface of the semiconductor wafer in an extremely short time, thereby achieving only the activation of impurities without deep diffusion of the impurities.

It has also been under consideration to apply the flash lamp annealing to the formation of silicides in field-effect transistors (FETs). The silicide formation is a technique that forms compounds (silicides) of silicon with metals for the purpose of increasing the performance of the field-effect transistors. The formation of silicides reduces resistances in gates and source/drain regions to achieve the high-speed operation of the field-effect transistors. Examples of the metals that form silicides which are under consideration include nickel (Ni), cobalt (Co), and titanium (Ti). In particular, nickel is promising as the most suitable material for finer geometries.

The silicide formation is achieved by depositing a film of metal such as nickel on source/drain regions of a semiconductor wafer and then performing a heating treatment on the semiconductor wafer. At this time, when the heating treatment is performed for a long time, the silicide abnormally grows laterally (in a direction from the source/drain regions to the gate) to break through source/drain junctions, thereby giving rise to a problem such that leakage current increases rapidly. To overcome such a problem, it has been proposed, for example, in U.S. Patent Application Publication No. 2013/0078802 to perform a heating treatment in a short time by irradiating a surface of a semiconductor wafer with a metal film deposited thereon with a flash of light.

Unfortunately, it has turned out that the characteristics of an interface between the silicide and silicon of a base layer are degraded to cause an increase in resistance if only a flash heating treatment is performed in an extremely short time by merely irradiating a semiconductor wafer with a metal film deposited thereon with a flash of light as disclosed in U.S. Patent Application Publication No. 2013/0078802. Devices that will become much finer in geometries in the future are more subjected to the influence of oxygen because the silicides in the devices are reduced in thickness. It is also necessary to suppress the oxidation of the silicides after the formation of the silicides because the silicides themselves are easily susceptible to oxidation.

The degradation of the interface characteristics of the silicides and the oxidation of the silicides themselves are caused by the heating treatment in the presence of oxygen. Oxygen that causes these problems mainly includes residual oxygen in a chamber and oxygen adsorbed on the surface of the semiconductor wafer (mainly adsorbed in the form of water). In particular, oxygen remaining in the chamber during the flash heating treatment becomes a big factor in the increase in the thickness of a silicon oxide film. In general, semiconductor wafers are transported into and out of a chamber at ordinary pressure in a flash lamp annealer. Oxygen in the atmosphere flowing into the chamber during the transport remains in the chamber to increase the concentration of oxygen.

SUMMARY OF THE INVENTION

The present invention is intended for a method of irradiating a substrate with a flash of light to form a silicide or a germanide.

According to one aspect of the present invention, the method comprises the steps of: (a) transporting a substrate with a metal film deposited thereon into a chamber; (b) reducing the pressure in the chamber to a first pressure lower than atmospheric pressure; (c) returning the pressure in the chamber from the first pressure to a second pressure higher than the first pressure; and (d) irradiating a front surface of the substrate with a flash of light from a flash lamp while maintaining the pressure in the chamber at the second pressure.

The method is capable of decreasing the oxygen concentration in the chamber during the irradiation with a flash of light to suppress the increase in resistance of the silicide or germanide resulting from the entry of oxygen in the chamber into defects near the interface between the metal film and a base material.

Preferably, the second pressure is higher than the first pressure and lower than atmospheric pressure.

This shortens the time required to return the pressure, thereby improving a throughput.

Preferably, the second pressure is higher than atmospheric pressure.

This lowers the diffusion velocity of oxygen released from the chamber to restrain the oxygen from reaching the substrate.

Preferably, an exhaust flow rate from the chamber is increased with time in the step (b).

This prevents particles from swirling up due to the gas exhausted from the chamber.

Preferably, a supply flow rate to the chamber is increased with time in the step (c).

This prevents particles from swirling up due to the gas supplied into the chamber.

Preferably, an inert gas is caused to flow at a flow rate ranging from 50 to 100 liters per minute in the chamber, with the pressure in the chamber maintained at atmospheric pressure, after the step (d).

This allows particles created at the time of flash irradiation to be swept away out of the chamber.

Preferably, an inert gas is supplied into the chamber while opening a transport opening of the chamber in the step (a).

This prevents air from flowing into the chamber during the transport of the substrate into the chamber.

According to another aspect of the present invention, the method comprises the steps of: (a) transporting a substrate with a metal film deposited thereon into a chamber; (b) reducing the pressure in the chamber to a first pressure lower than atmospheric pressure; and (c) irradiating a front surface of the substrate with a flash of light from a flash lamp while maintaining the pressure in the chamber at the first pressure.

The method is capable of decreasing the oxygen concentration in the chamber during the irradiation with a flash of light to suppress the increase in resistance of the silicide or germanide resulting from the entry of oxygen in the chamber into defects near the interface between the metal film and a base material.

The present invention is also intended for a heat treatment apparatus for irradiating a substrate with a flash of light to form a silicide or a germanide.

According to one aspect of the present invention, the heat treatment apparatus comprises: a chamber for receiving therein a substrate with a metal film deposited thereon; a flash lamp for irradiating the substrate received in the chamber with a flash of light; an exhaust part for exhausting an atmosphere from the chamber; a gas supply part for supplying a predetermined treatment gas into the chamber; and a controller for controlling the exhaust part and the gas supply part so that a front surface of the substrate is irradiated with a flash of light from the flash lamp while the pressure in the chamber is returned to a second pressure after being reduced to a first pressure lower than atmospheric pressure, the second pressure being higher than the first pressure.

The heat treatment apparatus is capable of decreasing the oxygen concentration in the chamber during the irradiation with a flash of light to suppress the increase in resistance of the silicide or germanide resulting from the entry of oxygen in the chamber into defects near the interface between the metal film and a base material.

Preferably, the second pressure is higher than the first pressure and lower than atmospheric pressure.

This shortens the time required to return the pressure, thereby improving a throughput.

Preferably, the second pressure is higher than atmospheric pressure.

This lowers the diffusion velocity of oxygen released from the chamber to restrain the oxygen from reaching the substrate.

Preferably, the controller controls the exhaust part so that an exhaust flow rate from the chamber is increased with time when the pressure in the chamber is reduced to the first pressure.

This prevents particles from swirling up due to the gas exhausted from the chamber.

Preferably, the controller controls the gas supply part so that a supply flow rate to the chamber is increased with time when the pressure in the chamber is returned from the first pressure to the second pressure.

This prevents particles from swirling up due to the gas supplied into the chamber.

Preferably, the controller controls the exhaust part and the gas supply part so that an inert gas is caused to flow at a flow rate ranging from 50 to 100 liters per minute in the chamber, with the pressure in the chamber maintained at atmospheric pressure, after the irradiation with the flash of light.

This allows particles created at the time of flash irradiation to be swept away out of the chamber.

According to another aspect of the present invention, the heat treatment apparatus comprises: a chamber for receiving therein a substrate with a metal film deposited thereon; a flash lamp for irradiating the substrate received in the chamber with a flash of light; an exhaust part for exhausting an atmosphere from the chamber; a gas supply part for supplying a predetermined treatment gas into the chamber; and a controller for controlling the exhaust part and the gas supply part so that a front surface of the substrate is irradiated with a flash of light from the flash lamp while the pressure in the chamber is maintained at a first pressure lower than atmospheric pressure after being reduced to the first pressure.

The heat treatment apparatus is capable of decreasing the oxygen concentration in the chamber during the irradiation with a flash of light to suppress the increase in resistance of the silicide or germanide resulting from the entry of oxygen in the chamber into defects near the interface between the metal film and a base material.

It is therefore an object of the present invention to suppress an increase in resistance of silicides and the like.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a top plan view of the holder;

FIG. 4 is a side view of the holder as seen from one side;

FIG. 6 is a side view of the transfer mechanism;

FIG. 7 is a plan view showing an arrangement of halogen lamps;

FIG. 8 is a view showing a configuration of an exhaust part;

FIG. 11 is a graph showing changes in pressure in the chamber according to a second preferred embodiment of the present invention;

FIG. 12 is a graph showing changes in pressure in the chamber according to a third preferred embodiment of the present invention.

DESCRIPTION OF THE PREFERRED EMBODIMENTS

Preferred embodiments according to the present invention will now be described in detail with reference to the drawings.

First Preferred Embodiment

Figure 1:
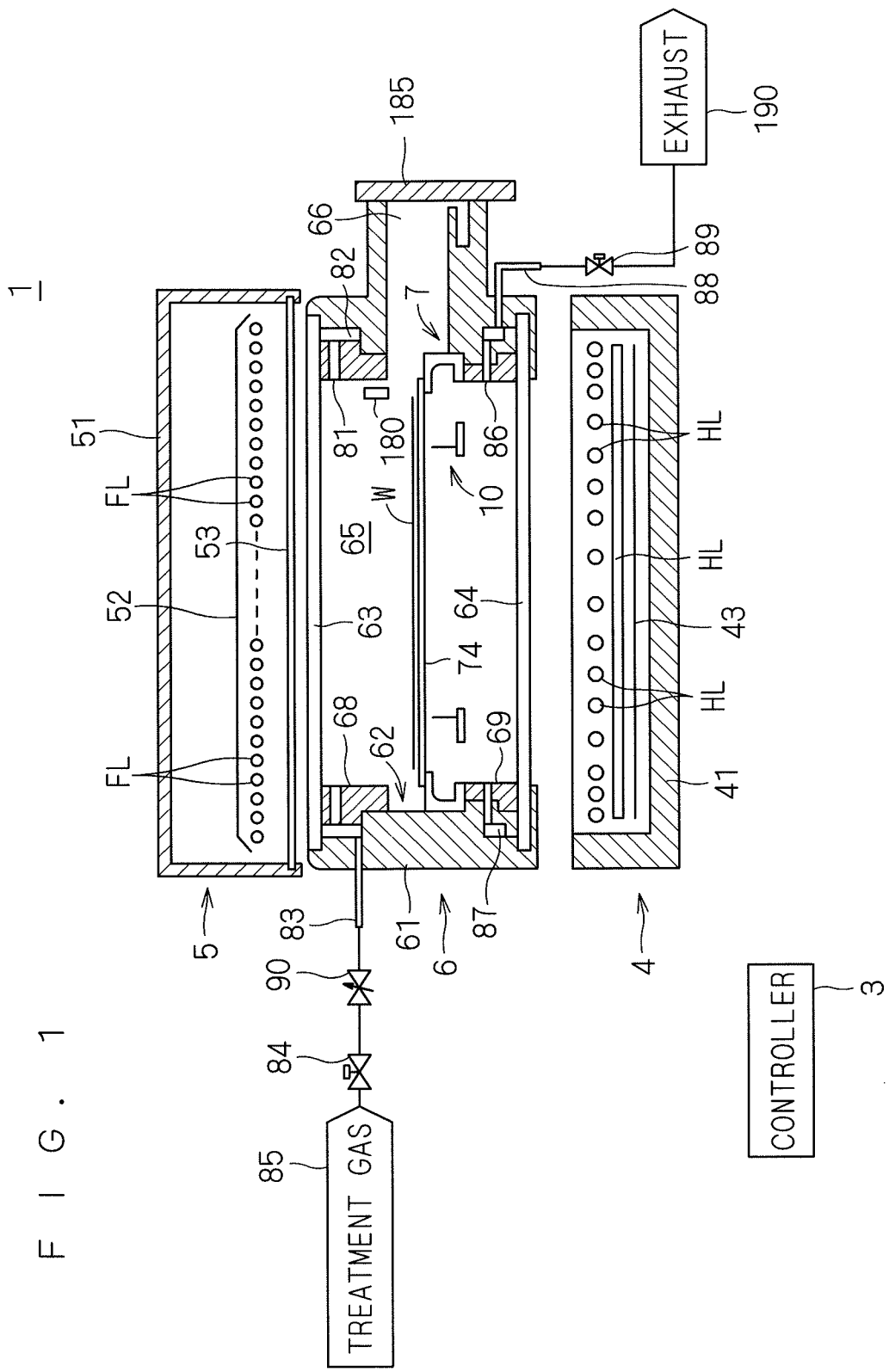
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 according to the present preferred embodiment is a flash lamp annealer for irradiating a disk-shaped semiconductor wafer W serving as a substrate with a flash of light to heat the semiconductor wafer W. The size of the semiconductor wafer W to be treated is not particularly limited. For example, the semiconductor wafer W to be treated has a diameter of 300 mm and 450 mm. The semiconductor wafer W prior to the transport into the heat treatment apparatus 1 has a film of metal such as nickel deposited thereon, and the heat treatment apparatus 1 performs a heating treatment on the semiconductor wafer W to thereby form and grow a silicide that is a compound of the metal and silicon. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6. The upper chamber window 63 and the lower chamber window 64 have a thickness of approximately 28 mm, for example.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W.

The chamber side portion 61 and the upper and lower reflective rings 68 and 69 are made of a metal material (e.g., stainless steel) with high strength and high heat resistance. The inner peripheral surfaces of the upper and lower reflective rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

At least one gas supply opening 81 for supplying a treatment gas (in this preferred embodiment, nitrogen ($N_2$) gas) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a gas supply source 85. The gas supply source 85 feeds nitrogen gas as the treatment gas to the gas supply pipe 83 under the control of the controller 3. A valve 84 and a flow regulating valve 90 are inserted at midpoints in the gas supply pipe 83. When the valve 84 is opened, the treatment gas is fed from the gas supply source 85 to the buffer space 82. The flow rate of the treatment gas flowing through the gas supply pipe 83 to the buffer space 82 is regulated by the flow regulating valve 90. The flow rate of the treatment gas determined by the flow regulating valve 90 is variable by the control of the controller 3. The treatment gas flowing in the buffer space 82 flows in a spreading manner within the buffer space 82 which is lower in fluid resistance than the gas supply opening 81, and is supplied through the gas supply opening 81 into the heat treatment space 65. It should be noted that the treatment gas is not limited to nitrogen gas, but may be inert gases such as argon (Ar) and helium (He), and reactive gases such as hydrogen ($H_2$), ammonia ($NH_3$), chlorine ($Cl_2$) and hydrogen chloride (HCl).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

FIG. 8 is a view showing a configuration of the exhaust part 190. The exhaust part 190 includes an exhaust pump 191, a flow regulating valve 196, three bypass lines 197, 198 and 199, and three exhaust valves 192, 193 and 194. The gas exhaust pipe 88 guiding the gas exhausted from the chamber 6 is connected through the three bypass lines 197, 198 and 199 to the exhaust pump 191. The three bypass lines 197, 198 and 199 are provided in parallel with each other. The three bypass lines 197, 198 and 199 are different in pipe diameter from each other. The bypass line 197 has the smallest diameter, and the bypass line 199 has the largest diameter. The bypass line 198 has a diameter intermediate between the diameters of the bypass lines 197 and 199. Thus, the bypass lines 197, 198 and 199 are listed in order of increasing flow rate of the gas that can pass therethrough.

The three exhaust valves 192, 193 and 194 are provided respectively in the three bypass lines 197, 198 and 199. Specifically, the exhaust valve 192 is inserted in the bypass line 197; the exhaust valve 193 is inserted in the bypass line 198; and the exhaust valve 194 is inserted in the bypass line 199. When the three exhaust valves 192, 193 and 194 are opened while the exhaust pump 191 is in operation, the gas exhausted from the chamber 6 and guided by the gas exhaust pipe 88 passes through the corresponding bypass lines 197, 198 and 199 and is then suctioned by the exhaust pump 191.

The three bypass lines 197, 198 and 199 are different in exhaust capability from each other because of their different pipe diameters. The exhaust capability increases as the pipe diameter increases. The bypass lines 197, 198 and 199 are listed in order of increasing exhaust capability. Thus, the exhaust flow rate from the chamber 6 is controlled by opening or closing each of the three exhaust valves 192, 193 and 194. Any one of the three exhaust valves 192, 193 and 194 may be opened. Alternatively, two or all of the three exhaust valves 192, 193 and 194 may be opened. For example, when the exhaust valves 193 and 194 are closed and only the exhaust valve 192 is opened, the gas is exhausted at the lowest exhaust flow rate. When all of the three exhaust valves 192, 193 and 194 are opened, the gas is exhausted at the highest exhaust flow rate.

The flow regulating valve 196 is inserted between the joint portion of the three bypass lines 197, 198 and 199 and the exhaust pump 191. The exhaust flow rate in the gas exhaust pipe 88 is also regulatable by the flow regulating valve 196. The exhaust flow rate determined by the flow regulating valve 196 is variable by the control of the controller 3. While the three bypass lines 197, 198 and 199 constitute a mechanism that regulates the exhaust flow rate in a discontinuous and multi-step manner, the flow regulating valve 196 is a mechanism that regulates the exhaust flow rate in a continuous and stepless manner.

The gas supply pipe 83, the gas exhaust pipe 88 and the three bypass lines 197, 198 and 199 are made of stainless steel with high strength and high resistance to corrosion. A pressure gauge 180 for measuring the pressure in the heat treatment space 65 is provided in the chamber 6. Preferably, the pressure gauge 180 has a measurement range of approximately 5 Pa to 0.2 MPa.

Figure 2:
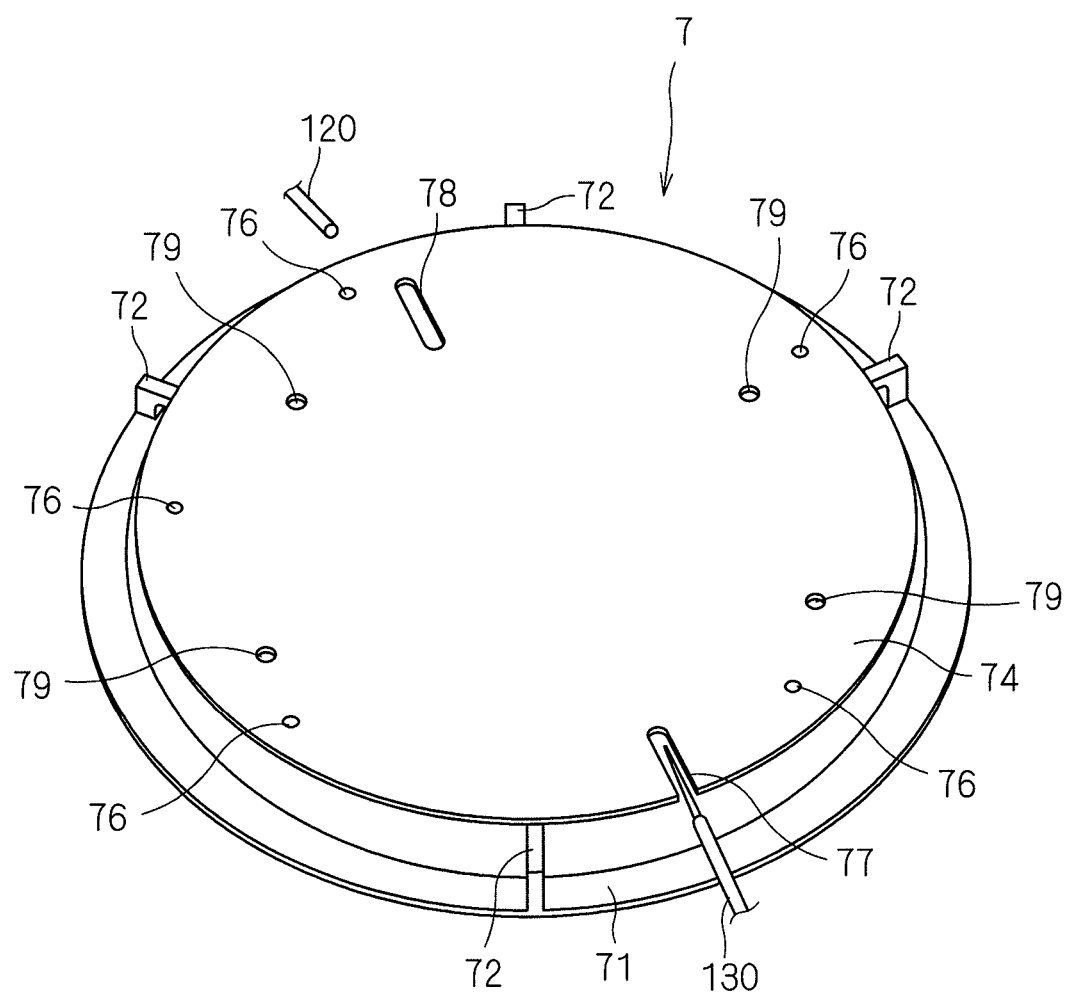
FIG. 2 is a perspective view showing the entire external appearance of a holder.

FIG. 2 is a perspective view showing the entire external appearance of the holder 7. FIG. 3 is a top plan view of the holder 7. FIG. 4 is a side view of the holder 7 as seen from one side. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member in the form of an annular ring. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 in the form of the annular ring and arranged in a circumferential direction of the base ring 71. The coupling portions 72 are quartz members, and are rigidly secured to the base ring 71 by welding. The base ring 71 may be of an arcuate shape such that a portion is removed from the annular ring.

The susceptor 74 having a planar shape is supported by the four coupling portions 72 provided on the base ring 71. The susceptor 74 is a generally circular planar member made of quartz. The diameter of the susceptor 74 is greater than that of a semiconductor wafer W. In other words, the susceptor 74 has a size, as seen in plan view, greater than that of the semiconductor wafer W. Multiple (in the present preferred embodiment, five) guide pins 76 are mounted upright on the upper surface of the susceptor 74. The five guide pins 76 are disposed along the circumference of a circle concentric with the outer circumference of the susceptor 74. The diameter of a circle on which the five guide pins 76 are disposed is slightly greater than the diameter of the semiconductor wafer W. The guide pins 76 are also made of quartz. The guide pins 76 may be machined from a quartz ingot integrally with the susceptor 74. Alternatively, the guide pins 76 separately machined may be attached to the susceptor 74 by welding and the like.

The four coupling portions 72 provided upright on the base ring 71 and the lower surface of a peripheral portion of the susceptor 74 are rigidly secured to each other by welding. In other words, the susceptor 74 and the base ring 71 are fixedly coupled to each other with the coupling portions 72, and the holder 7 is an integrally formed member made of quartz. The base ring 71 of such a holder 7 is supported by the wall surface of the chamber 6, whereby the holder 7 is mounted to the chamber 6. With the holder 7 mounted to the chamber 6, the susceptor 74 of a generally disc-shaped configuration assumes a horizontal attitude (an attitude such that the normal to the susceptor 74 coincides with a vertical direction). A semiconductor wafer W transported into the chamber 6 is placed and held in a horizontal attitude on the susceptor 74 of the holder 7 mounted to the chamber 6. The semiconductor wafer W is placed inside the circle defined by the five guide pins 76. This prevents the horizontal misregistration of the semiconductor wafer W. The number of guide pins 76 is not limited to five, but may be determined so as to prevent the misregistration of the semiconductor wafer W.

As shown in FIGS. 2 and 3, an opening 78 and a notch 77 are provided in the susceptor 74 so as to extend vertically through the susceptor 74. The notch 77 is provided to allow a distal end portion of a probe of a contact-type thermometer 130 including a thermocouple to pass therethrough. The opening 78, on the other hand, is provided for a radiation thermometer 120 to receive radiation (infrared radiation) emitted from the lower surface of the semiconductor wafer W held by the susceptor 74. The susceptor 74 further includes four through holes 79 bored therein and designed so that lift pins 12 of the transfer mechanism 10 to be described later pass through the through holes 79, respectively, to transfer a semiconductor wafer W.

Figure 5:
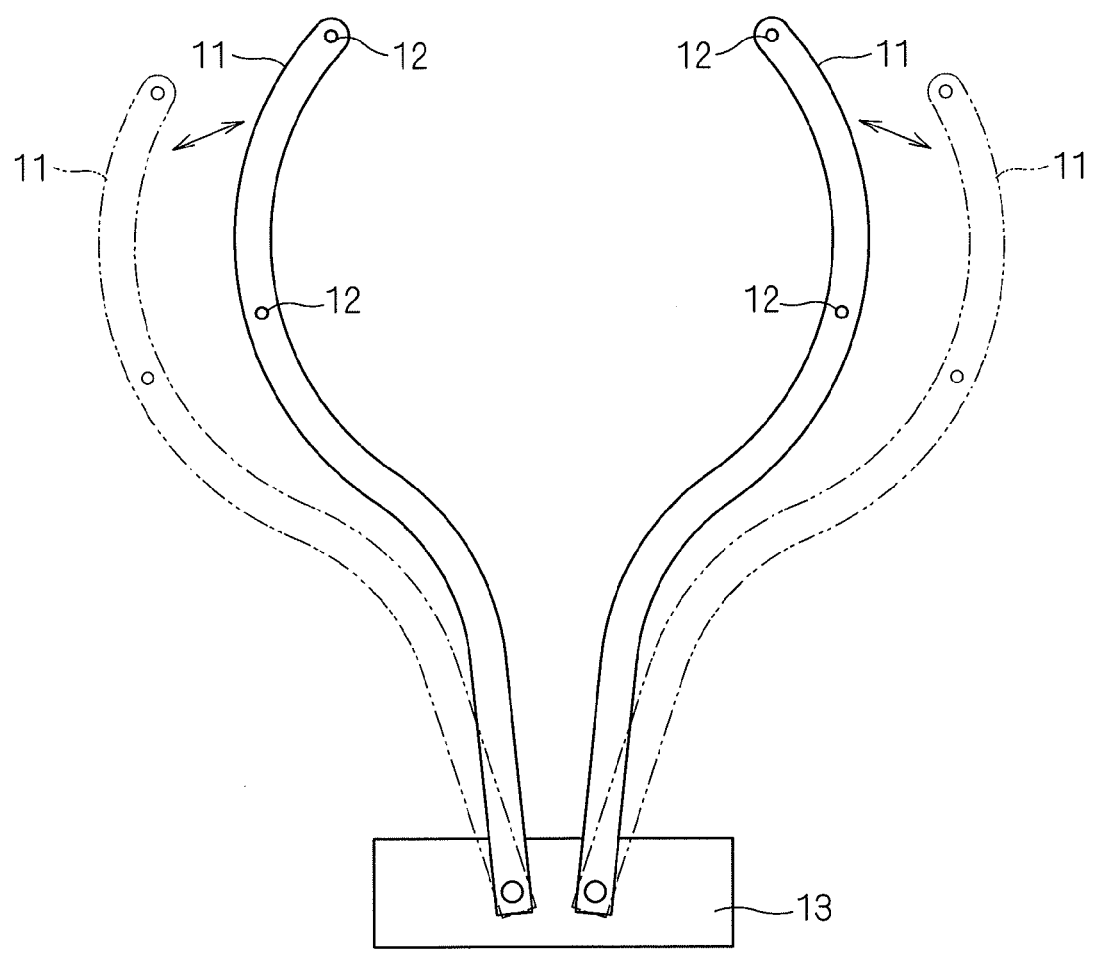
FIG. 5 is a plan view of a transfer mechanism.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 is a light irradiator that directs light from under the chamber 6 through the lower chamber window 64 toward the heat treatment space 65 to heat the semiconductor wafer W by means of the halogen lamps HL.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuously lighted lamps which emit light continuously at least for a time period of not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. Also, the controller 3 controls the valve 84, the valve 89, the flow regulating valve 90, the flow regulating valve 196, the exhaust pump 191 and the three exhaust valves 192, 193 and 194 to adjust the pressure in the heat treatment space 65 in the chamber 6, a gas supply flow rate to the chamber 6, and an exhaust flow rate from the chamber 6.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a semiconductor substrate including a metal film deposited on a base material of silicon. The heat treatment apparatus 1 irradiates the semiconductor wafer W with a flash of light to heat the semiconductor wafer W, thereby forming a silicide.

Figure 9:
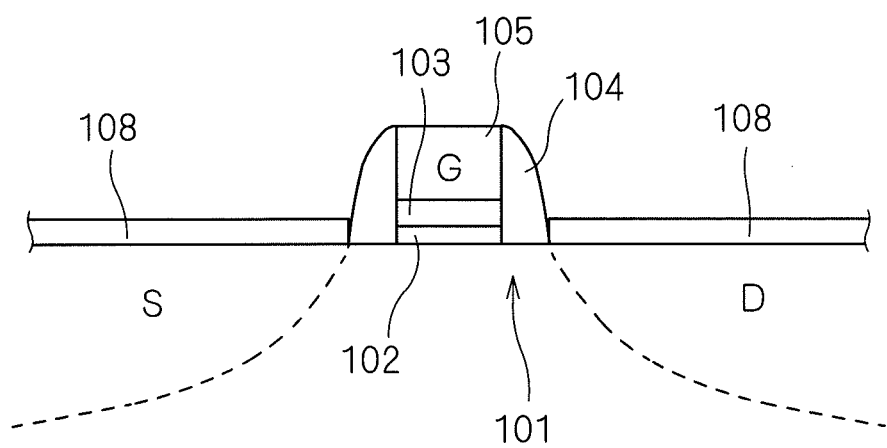
FIG. 9 is a view showing a structure in which a metal film is deposited on a semiconductor wafer.

FIG. 9 is a view showing a structure in which a metal film is deposited on the semiconductor wafer W. A silicon oxide film ($SiO_2$) 102 is formed on a base material 101 of silicon of the semiconductor wafer W. The silicon oxide film 102 is a layer required as an interface layer film between the base material 101 of silicon and a high dielectric constant film 103. The thickness of the silicon oxide film 102 is extremely small and is approximately 1 nm, for example. Various known methods such as a thermal oxidation method may be used as a technique for forming the silicon oxide film 102.

The high dielectric constant film 103 serving as a gate insulator film is formed on the silicon oxide film 102. Examples of the material of the high dielectric constant film 103 used herein include high dielectric constant materials such as $HfO_2$, $ZrO_2$, $Al_2O_3$ and $La_2O_3$ (in the present preferred embodiment, $HfO_2$), for example. The high dielectric constant film 103 is formed by depositing such a high dielectric constant material on the silicon oxide film 102 through the use of ALD (atomic layer deposition), for example. Although the high dielectric constant film 103 deposited on the silicon oxide film 102 has a thickness of several nanometers, the EOT (equivalent oxide thickness) of the high dielectric constant film 103 is on the order of 1 nm. The method of forming the high dielectric constant film 103 is not limited to the ALD, but known techniques such as MOCVD (metal organic chemical vapor deposition), for example, may be used to form the high dielectric constant film 103.

A gate electrode 105 is formed on the high dielectric constant film 103. The gate electrode 105 according to the present preferred embodiment is a metal gate electrode made of titanium (Ti) or titanium nitride (TiN). The gate electrode 105 need not be the metal gate electrode, but may be made of polysilicon. Side walls 104 made of SiN are formed on opposite sides of the gate electrode 105. The side walls 104 are formed before the high dielectric constant film 103 in a gate-last process.

Portions of the upper surface of the base material 101 of silicon which lie on opposite sides of the gate electrode 105 serve as source/drain regions (regions defined by dotted lines in FIG. 9). Ions are implanted in the source/drain regions by an ion implantor.

A metal film 108 is deposited on the source/drain regions. Examples of a metal material for use in silicide technology include nickel (Ni), cobalt (Co), titanium (Ti), tungsten (W) and the like (in the present preferred embodiment, nickel). The metal film 108 is deposited by known deposition techniques such as sputtering and vacuum evaporation.

The heat treatment apparatus 1 heat-treats the semiconductor wafer W in which the metal film 108 is deposited on the source/drain regions of the base material 101 of silicon as shown in FIG. 9. A procedure for the operation in the heat treatment apparatus 1 will be described hereinafter. The procedure for the operation in the heat treatment apparatus 1 proceeds under the control of the controller 3 over the operating mechanisms of the heat treatment apparatus 1.

First, the semiconductor wafer W with the metal film 108 deposited thereon is transported into the chamber 6 of the heat treatment apparatus 1. For the transport of the semiconductor wafer W into the chamber 6, the gate valve 185 is opened to open the transport opening 66. A transport robot outside the heat treatment apparatus 1 transports the semiconductor wafer W with the metal film 108 deposited thereon through the transport opening 66 into the heat treatment space 65 of the chamber 6. At this time, air is carried into the heat treatment space 65 of the chamber 6 as the semiconductor wafer W is transported into the heat treatment space 65 because the pressure inside and outside the chamber 6 is equal to atmospheric pressure. To prevent this, nitrogen gas may be continuously supplied from the gas supply source 85 into the chamber 6 by opening the valve 84 to cause the nitrogen gas to flow outwardly through the opened transport opening 66, thereby minimizing the atmosphere outside the apparatus flowing into the chamber 6. It is also preferable that the supply flow rate of the nitrogen gas is increased when the gate valve 185 is open, as compared with the supply flow rate during the heat treatment of the semiconductor wafer W (for example, the supply flow rate is 120 liters per minute when the gate valve 185 is open whereas the supply flow rate is normally 30 liters per minute during the heat treatment). It is further preferable that the valve 89 is closed to stop exhausting the gas from the chamber 6 at the same time that the supply flow rate of the nitrogen gas is increased. This causes the nitrogen gas supplied into the chamber 6 to flow outwardly only through the transport opening 66, thereby effectively preventing outside air from flowing into the chamber 6.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the susceptor 74 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude. The semiconductor wafer W is held on the susceptor 74 in such an attitude that a front surface thereof where the metal film 108 is deposited is the upper surface. Also, the semiconductor wafer W is held inside the five guide pins 76 on the upper surface of the susceptor 74. The pair of transfer arms 11 moved downwardly below the susceptor 74 is moved back to the retracted position, i.e. to the inside of the recessed portion 62, by the horizontal movement mechanism 13.

After the semiconductor wafer W is received in the chamber 6 and the transport opening 66 is closed by the gate valve 185, the pressure in the chamber 6 is reduced to a pressure lower than atmospheric pressure. Specifically, the transport opening 66 is closed, so that the heat treatment space 65 of the chamber 6 becomes an enclosed space. In this state, the valve 89 for exhausting the gas is opened while the valve 84 for supplying the gas is closed. The controller 3 opens the exhaust valve 192 provided in the bypass line 197 having the smallest pipe diameter of the three bypass lines 197, 198 and 199 while operating the exhaust pump 191. The remaining exhaust valves 193 and 194 are closed. Thus, the gas is exhausted from the chamber 6 while the gas is not supplied into the chamber 6, so that the pressure in the heat treatment space 65 of the chamber 6 is reduced.

Figure 10:
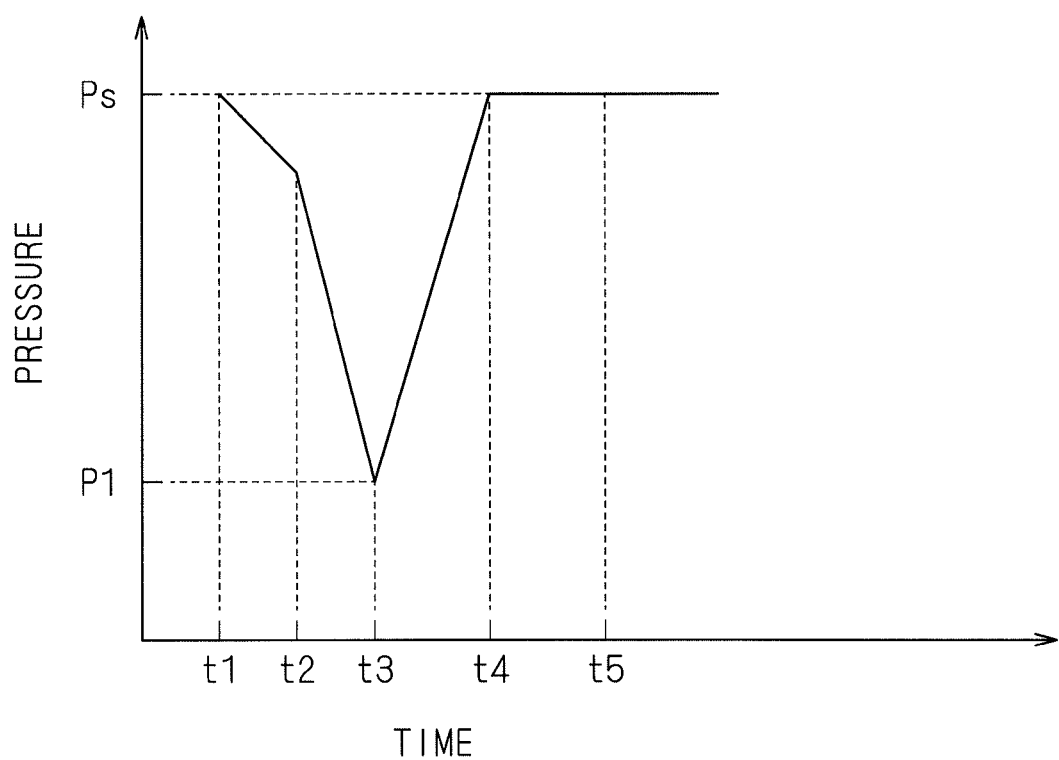
FIG. 10 is a graph showing changes in pressure in a chamber according to a first preferred embodiment of the present invention.

FIG. 10 is a graph showing changes in pressure in the chamber 6 according to the first preferred embodiment. In FIG. 10, the abscissa represents time, and the ordinate represents pressure in the chamber 6. At the point in time when the semiconductor wafer W is received in the chamber 6 and the transport opening 66 is closed, the pressure in the chamber 6 is equal to ordinary pressure Ps (=atmospheric pressure=approximately 101325 Pa). At time t1, the reduction in pressure in the chamber 6 starts. In an early stage of the pressure reduction, only the bypass line 197 having the smallest pipe diameter of the three bypass lines 197, 198 and 199 is used, so that the exhaust flow rate is low and an exhaust speed is relatively low.

Next, at time t2, the controller 3 opens all of the three exhaust valves 192, 193 and 194. This increases the exhaust flow rate from the chamber 6, so that the exhaust speed becomes faster. Then, at time t3, the pressure (degree of vacuum) in the chamber 6 reaches a pressure P1. The pressure P1 is, for example, approximately 100 Pa. That is, after the gas is exhausted at a low exhaust flow rate in the early stage of the pressure reduction, the exhaust flow rate is changed to a higher exhaust flow rate, and the gas is exhausted at the higher exhaust flow rate. The flow rate in the flow regulating valve 196 is constant in the first preferred embodiment.

If the gas is exhausted rapidly at a high exhaust flow rate at the start of the pressure reduction, there is a danger that a large gas flow change occurs in the chamber 6 to cause particles deposited on structures (e.g., the lower chamber window 64) of the chamber 6 to swirl up and be deposited again on the semiconductor wafer W, resulting in contamination of the semiconductor wafer W. When the exhaust flow rate is changed to a higher exhaust flow rate and the gas is exhausted at the higher exhausted flow rate after the gas is exhausted calmly at a low exhaust flow rate in the early stage of the pressure reduction, such particles in the chamber 6 are prevented from swirling up.

At the time t3 when the pressure in the chamber 6 reaches the pressure P1, the valve 89 for exhausting the gas is closed and the valve 84 for supplying the gas is opened, so that the nitrogen gas is supplied from the gas supply source 85 into the heat treatment space 65 of the chamber 6. As a result, a nitrogen atmosphere is formed around the semiconductor wafer W held by the holder 7 in the chamber 6. While the nitrogen gas is supplied into the chamber 6, only the bypass line 197 having the smallest pipe diameter may be used to exhaust the gas from the chamber 6. In this case, the supply flow rate of the treatment gas is of course higher than the exhaust flow rate thereof.

By supplying the nitrogen gas into the chamber 6, the pressure in the chamber 6 is increased from the pressure P1 to return to the ordinary pressure Ps at time t4. In the first preferred embodiment, the pressure in the chamber 6 is reduced once to the pressure P1 and then returned to the ordinary pressure Ps. This achieves an oxygen concentration of not greater than approximately 200 ppb in the nitrogen atmosphere in the chamber 6 after the pressure return to the ordinary pressure Ps.

After the time t4 when the pressure in the chamber 6 is returned to the ordinary pressure Ps, the supply flow rate of the nitrogen gas to the chamber 6 and the exhaust flow rate thereof from the chamber 6 are made equal to each other, so that the pressure in the chamber 6 is maintained at the ordinary pressure Ps.

At the time t4 when the pressure in the chamber 6 is returned to the ordinary pressure Ps, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the back surface of the semiconductor wafer W. The back surface of the semiconductor wafer W refers to a main surface thereof on the opposite side from the front surface with the metal film 108 deposited thereon. The semiconductor wafer W is irradiated with the halogen light from the halogen lamps HL, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the contact-type thermometer 130 when the halogen lamps HL perform the preheating. Specifically, the contact-type thermometer 130 incorporating a thermocouple comes through the notch 77 into contact with the lower surface of the semiconductor wafer W held by the susceptor 74 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL, based on the value measured with the contact-type thermometer 130, so that the temperature of the semiconductor wafer W is equal to the preheating temperature T1. The preheating temperature T1 is in the range of room temperature to 300° C., and shall be 200° C. in the present preferred embodiment. It should be noted that, when the temperature of the semiconductor wafer W is increased by the irradiation with light from the halogen lamps HL, the temperature is not measured with the radiation thermometer 120. This is because the halogen light emitted from the halogen lamps HL enters the radiation thermometer 120 in the form of disturbance light to obstruct the precise measurement of the temperature.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the contact-type thermometer 130 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W including the metal film 108 is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Further, the inner peripheral surface of the lower reflective ring 69 mounted to the chamber side portion 61 is provided as a mirror surface. Thus, a greater amount of light is reflected from the inner peripheral surface of the lower reflective ring 69 toward the peripheral portion of the semiconductor wafer W. This provides a more uniform in-plane temperature distribution of the semiconductor wafer W in the stage of preheating. It should be noted that the pressure in the chamber 6 during the preheating is maintained at the ordinary pressure Ps.

Next, the flash lamps FL emit a flash of light to perform a flash heating treatment at time t5 when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. By irradiating the front surface of the semiconductor wafer W with the metal film 108 deposited thereon with the flash of light from the flash lamps FL, silicon in the source/drain regions and the metal film 108 react with each other to form a silicide (in the present preferred embodiment, nickel silicide).

A treatment temperature T2 that is the maximum temperature (peak temperature) reached by the front surface of the semiconductor wafer W subjected to the flash irradiation is in the range of 600° C. to 1000° C. where the silicide grows, and shall be 900° C. in the present preferred embodiment. The light emission time of the flash lamps FL is as short as not greater than one second. The time period for the irradiation of light from the flash lamps FL is a short time period ranging from about 0.1 to about 100 milliseconds.

Accordingly, the time required for the temperature of the front surface of the semiconductor wafer W to increase from the preheating temperature T1 to the treatment temperature T2 is also an extremely short time period of less than one second. Immediately after the flash irradiation, the temperature of the front surface of the semiconductor wafer W rapidly decreases from the treatment temperature T2.

After a predetermined time period has elapsed since the completion of the flash heating treatment, the halogen lamps HL turn off. This causes the temperature of the semiconductor wafer W to decrease from the preheating temperature T1. The contact-type thermometer 130 or the radiation thermometer 120 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

In the first preferred embodiment, the pressure in the chamber 6 is reduced once to the pressure P1 lower than atmospheric pressure and then returned to the ordinary pressure Ps by supplying the nitrogen gas. This achieves an oxygen concentration of not greater than approximately 200 ppb in the chamber 6 after the pressure return to the ordinary pressure Ps. If the atmosphere in the chamber 6 is replaced with the nitrogen gas while the pressure in the chamber 6 is not reduced but is maintained at the ordinary pressure, the limit to which the oxygen concentration in the chamber 6 can be decreased is approximately 2 ppm. That is, the process of reducing the pressure in the chamber 6 once to the pressure P1 and thereafter returning the pressure in the chamber 6 to the ordinary pressure Ps as in the present preferred embodiment achieves the decrease in the oxygen concentration in the chamber 6 to approximately one tenth, as compared with the process in which the pressure reduction is not performed.

When no special process is performed after the metal film 108 is deposited on the source/drain regions of the base material 101 of silicon, a large number of defects are present near the interface between the metal film 108 and the base material 101 of silicon. If the heat treatment for the silicide formation is performed with the oxygen concentration maintained high around the semiconductor wafer W, oxygen in the atmosphere enters the defects near the interface between the metal film 108 and the base material 101. As a result, the interface and its surroundings are degraded to have a high resistance. Also, there are cases in which the silicide of nickel itself is oxidized. Oxygen remaining in the chamber 6 is a particular problem as a cause of such oxidation. When the semiconductor wafer W is transported into the chamber 6 at an ordinary pressure as in the present preferred embodiment, a large amount of outside air is carried into the chamber 6 to increase the residual oxygen concentration in the chamber 6. It is hence preferable to heat the semiconductor wafer W with the metal film 108 deposited thereon to minimize the oxygen concentration in the atmosphere during the formation of the silicide.

In the first preferred embodiment, the pressure in the chamber 6 is reduced once to the pressure P1 lower than atmospheric pressure and then returned to the ordinary pressure Ps, so that the oxygen concentration in the heat treatment space 65 of the chamber 6 during the formation of the silicide is decreased to approximately 200 ppb or less. This suppresses the increase in resistance of the silicide resulting from the entry of oxygen in the heat treatment space 65 into the defects near the interface between the metal film 108 and the base material 101 during the process of silicide formation. Also, the oxidation of the silicide itself is prevented.

The silicide is required to be as thin as possible. In the first preferred embodiment, the excessive increase in the thickness of the silicide is suppressed because the temperature of the front surface of the semiconductor wafer W is increased to the treatment temperature T2 in an extremely short time by irradiating the front surface of the semiconductor wafer W with a flash of light from the flash lamps FL for a time period of less than one second.

Increasing the supply flow rate of the nitrogen gas during the transport of the semiconductor wafer W into the chamber 6 to cause the nitrogen gas to flow outwardly through the transport opening 66 prevents outside air from flowing inwardly during the transport of the semiconductor wafer W into the chamber 6 to decrease the initial value of the oxygen concentration in the chamber 6 prior to the treatment. This achieves a sufficiently low residual oxygen concentration if the pressure P1 which is the pressure reached during the pressure reduction in the chamber 6 is high.

Further, after the gas is exhausted at a low flow rate at the start of the pressure reduction in the chamber 6, the exhaust flow rate is changed to a higher exhaust flow rate and the gas is exhausted at the higher exhaust flow rate, as mentioned above. This prevents particles in the chamber 6 from swirling up.

Second Preferred Embodiment

Next, a second preferred embodiment according to the present invention will be described. The heat treatment apparatus 1 of the second preferred embodiment is exactly identical in configuration with that of the first preferred embodiment. The procedure for treatment of the semiconductor wafer W in the heat treatment apparatus 1 of the second preferred embodiment is substantially similar to that of the first preferred embodiment. The second preferred embodiment differs from the first preferred embodiment in the pressure to which the reduced pressure in the chamber 6 is returned.

FIG. 11 is a graph showing changes in pressure in the chamber 6 according to the second preferred embodiment. In FIG. 11, the abscissa represents time, and the ordinate represents pressure in the chamber 6, as in FIG. 10. A pressure change pattern (pattern of FIG. 10) obtained when the pressure in the chamber 6 is returned to the ordinary pressure Ps in the first preferred embodiment is indicated by dotted lines in FIG. 11.

At the point in time when the semiconductor wafer W with the metal film 108 deposited thereon is received in the chamber 6 and the transport opening 66 is closed, the pressure in the chamber 6 is equal to the ordinary pressure Ps (=atmospheric pressure=approximately 101325 Pa), as in the first preferred embodiment. Then, the reduction in pressure in the chamber 6 starts at the time t1. After the gas is exhausted at a low exhaust flow rate in the early stage of the pressure reduction, the exhaust flow rate is changed to a higher exhaust flow rate at the time t2, and the gas is exhausted at the higher exhaust flow rate, as in the first preferred embodiment. This prevents particles in the chamber 6 from swirling up.

At the time t3 when the pressure in the chamber 6 reaches the pressure P1, the valve 89 for exhausting the gas is closed and the valve 84 for supplying the gas is opened, so that the nitrogen gas is supplied from the gas supply source 85 into the heat treatment space 65 of the chamber 6. The operation thus far described is similar to that of the first preferred embodiment. The pressure P1 is, for example, approximately 100 Pa.

In the second preferred embodiment, the pressure in the chamber 6 is not returned to the ordinary pressure Ps but is returned to a pressure P2 at time t6 by supplying the nitrogen gas. The pressure P2 is higher than the pressure P1 and lower than the ordinary pressure Ps. The pressure P2 is, for example, approximately 5000 Pa. In the second preferred embodiment, the pressure in the chamber 6 is reduced once to the pressure P1 and then returned to the pressure P2 higher than the pressure P1. This achieves an oxygen concentration of not greater than approximately 200 ppb in the chamber 6 after the pressure return to the pressure P2.

After the time t6 when the pressure in the chamber 6 is returned to the pressure P2, the supply flow rate of the nitrogen gas to the chamber 6 and the exhaust flow rate thereof from the chamber 6 are made equal to each other, so that the pressure in the chamber 6 is maintained at the pressure P2. While the pressure in the chamber 6 is maintained at the pressure P2, the preheating of the semiconductor wafer W is performed by the halogen lamps HL, and the flash heating is thereafter performed at time t7 by irradiating the front surface of the semiconductor wafer W with a flash of light from the flash lamps FL. The details of the preheating and the flash heating treatment in the second preferred embodiment are identical with those in the first preferred embodiment. By irradiating the front surface of the semiconductor wafer W with the metal film 108 deposited thereon with the flash of light from the flash lamps FL, silicon in the source/drain regions and the metal film 108 react with each other to form a silicide.

After a predetermined time period has elapsed since the completion of the flash heating treatment, the valve 89 for exhausting the gas is closed and the valve 84 for supplying the gas is opened, so that the nitrogen gas is supplied from the gas supply source 85 into the chamber 6 to return the pressure in the chamber 6 to the ordinary pressure Ps. The halogen lamps HL turn off. This causes the temperature of the semiconductor wafer W to decrease from the preheating temperature T1. The procedure for the subsequent transport of the semiconductor wafer W the temperature of which is decreased to a predetermined temperature out of the chamber 6 of the heat treatment apparatus 1 in the second preferred embodiment is similar to that in the first preferred embodiment.

Factors responsible for the particles swirling up in the chamber 6 include the flash irradiation in addition to the gas supplied to and exhausted from the chamber 6. At the time of the flash irradiation from the flash lamps FL, the temperature of the front surface of the semiconductor wafer W is momentarily increased, whereas the temperature of the back surface of the semiconductor wafer W is not so much increased from the preheating temperature T1. Thus, a large temperature difference arises between the front and back surfaces of the semiconductor wafer W. This causes the thermal expansion of only the front surface of the semiconductor wafer W to result in the abrupt deformation of the semiconductor wafer W. As a result, the semiconductor wafer W vibrates on the susceptor 74 to create particles, which in turn swirl up in the chamber 6.

To effectively discharging such particles resulting from the flash irradiation from the chamber 6, the second preferred embodiment performs the following operation. When the nitrogen gas is supplied into the chamber 6 to return the pressure in the chamber 6 to the ordinary pressure Ps after the flash heating treatment, the valve 89 for exhausting the gas is opened, and the nitrogen gas is caused to flow at a flow rate in the range of 50 to 100 liters per minute in the chamber 6, thereby sweeping away the particles resulting from the flash irradiation. This prevents the particles resulting from the flash irradiation from being deposited on and contaminating the semiconductor wafer W.

When the nitrogen gas is supplied into the chamber 6 to return the pressure in the chamber 6 to the ordinary pressure Ps after the flash heating treatment, the valve 84 for supplying the gas may be opened to supply the nitrogen gas into the chamber 6 while the valve 89 for exhausting the gas is left open. This achieves more effective discharge of the particles resulting from the flash irradiation from the chamber 6.

In the second preferred embodiment, the pressure in the chamber 6 is reduced once to the pressure P1 lower than atmospheric pressure and then returned to the pressure P2 by supplying the nitrogen gas into the chamber 6, so that an oxygen concentration of not greater than approximately 200 ppb in the heat treatment space 65 of the chamber 6 during the heat treatment for the formation of the silicide is achieved as in the first preferred embodiment. This suppresses the increase in resistance of the silicide resulting from the entry of oxygen in the heat treatment space 65 into the defects near the interface between the metal film 108 and the base material 101 during the process of silicide formation. Also, the oxidation of the silicide itself is prevented.

Also, the excessive increase in the thickness of the silicide is suppressed because the temperature of the front surface of the semiconductor wafer W is increased to the treatment temperature T2 in an extremely short time by irradiating the front surface of the semiconductor wafer W with a flash of light from the flash lamps FL for a time period of less than one second, as in the first preferred embodiment.

The heat treatment under a reduced pressure promotes the desorption of impurities contained in the metal film 108. By discharging such desorbed impurity elements from the chamber 6, the impurities are prevented from being deposited again on and contaminating the front surface of the semiconductor wafer W. As a result, this prevents the degradation of device performance and the decrease in yield.

Also, the efficiency of temperature increase during the preheating and during the flash heating is enhanced because the absorption of halogen lamp light and flashes of light by an atmosphere gas in the chamber 6 is reduced. As a result, this achieves the increase in attained surface temperature of the semiconductor wafer W during the flash heating.

The heating treatment of the semiconductor wafer W under a reduced pressure reduces the influence of convection in the chamber 6 to improve the uniformity of the in-plane temperature distribution of the semiconductor wafer W.

In the second preferred embodiment, the pressure in the chamber 6 is not returned to the ordinary pressure Ps but is returned from the pressure P1 to the pressure P2 lower than atmospheric pressure. The return of the pressure in the chamber 6 to the pressure P2 as in the second preferred embodiment achieves the reduction in the time required for the pressure return, as compared with the return of the pressure in the chamber 6 to the ordinary pressure Ps as in the first preferred embodiment. The moment of the flash irradiation may be moved forward by the amount of the reduction in the time required for the pressure return (the time t7 of the flash irradiation in the second preferred embodiment is earlier than the time t5 of the flash irradiation in the first preferred embodiment). As a result, the return of the pressure in the chamber 6 to the pressure P2 lower than atmospheric pressure as in the second preferred embodiment improves the throughput in the heat treatment apparatus 1.

Third Preferred Embodiment

Next, a third preferred embodiment according to the present invention will be described. The heat treatment apparatus 1 of the third preferred embodiment is exactly identical in configuration with that of the first preferred embodiment. The procedure for treatment of the semiconductor wafer W in the heat treatment apparatus 1 of the third preferred embodiment is substantially similar to that of the first preferred embodiment. The third preferred embodiment differs from the first preferred embodiment in pressure changes in the chamber 6.

FIG. 12 is a graph showing changes in pressure in the chamber 6 according to the third preferred embodiment. In FIG. 12, the abscissa represents time, and the ordinate represents pressure in the chamber 6, as in FIG. 10.

At the point in time when the semiconductor wafer W with the metal film 108 deposited thereon is received in the chamber 6 and the transport opening 66 is closed, the pressure in the chamber 6 is equal to the ordinary pressure Ps (=atmospheric pressure=approximately 101325 Pa), as in the first preferred embodiment. Then, the reduction in pressure in the chamber 6 starts at the time t1. In the third preferred embodiment, the exhaust flow rate in the three bypass lines 197, 198 and 199 is made constant, and the exhaust flow rate from the chamber 6 is continuously increased with time by means of the flow regulating valve 196. That is, the exhausting of the gas starts at a relatively low exhaust flow rate in the early stage of the pressure reduction, and the exhaust flow rate is increased gradually continuously. This prevents particles in the chamber 6 from swirling up as in the first preferred embodiment. Also, increasing the exhaust flow rate in a continuous and stepless manner prevents particles from swirling up due to abrupt changes in exhaust flow rate.

At the time t3 when the pressure in the chamber 6 reaches the pressure P1, the valve 89 for exhausting the gas is closed and the valve 84 for supplying the gas is opened, so that the nitrogen gas is supplied from the gas supply source 85 into the heat treatment space 65 of the chamber 6 to return the pressure in the chamber 6. The pressure P1 is, for example, approximately 100 Pa.

In the third preferred embodiment, the supply flow rate of the treatment gas to the chamber 6 is continuously increased with time by means of the flow regulating valve 90. That is, the supply of the gas starts at a relatively low supply flow rate in the early stage of the pressure return, and the supply flow rate is increased gradually continuously. If the gas is supplied rapidly at a high supply flow rate at the start of the pressure return, there is a danger that particles deposited on the structures of the chamber 6 swirls up, as in the case of the pressure reduction. When the supply of the gas starts at a relatively low supply flow rate in the early stage of the pressure return and the supply flow rate is increased gradually, such particles in the chamber 6 are prevented from swirling up. Also, increasing the supply flow rate in a continuous and stepless manner prevents particles from swirling up due to abrupt changes in supply flow rate.

In the third preferred embodiment, the pressure in the chamber 6 is returned to a pressure P3 exceeding the ordinary pressure Ps at time t8 by supplying the nitrogen gas into the chamber 6. The pressure P3 is higher than atmospheric pressure, and is approximately 0.12 MPa, for example. In the third preferred embodiment, the pressure in the chamber 6 is reduced once to the pressure P1 and then returned to the pressure P3 higher than the pressure P1. This achieves an oxygen concentration of not greater than approximately 200 ppb in the chamber 6 after the pressure return to the pressure P3.

After the time t8 when the pressure in the chamber 6 is returned to the pressure P3, the supply flow rate of the nitrogen gas to the chamber 6 and the exhaust flow rate thereof from the chamber 6 are made equal to each other, so that the pressure in the chamber 6 is maintained at the pressure P3. While the pressure in the chamber 6 is maintained at the pressure P3, the preheating of the semiconductor wafer W is performed by the halogen lamps HL, and the flash heating is thereafter performed at time t9 by irradiating the front surface of the semiconductor wafer W with a flash of light from the flash lamps FL. The details of the preheating and the flash heating treatment in the third preferred embodiment are identical with those in the first preferred embodiment. By irradiating the front surface of the semiconductor wafer W with the metal film 108 deposited thereon with the flash of light from the flash lamps FL, silicon in the source/drain regions and the metal film 108 react with each other to form a silicide.

After the completion of the flash heating treatment, the gas in the chamber 6 is exhausted through the gas exhaust pipe 88, so that the pressure in the chamber 6 is equal to the ordinary pressure Ps. The halogen lamps HL turn off. This causes the temperature of the semiconductor wafer W to decrease from the preheating temperature T1. The procedure for the subsequent transport of the semiconductor wafer W the temperature of which is decreased to a predetermined temperature out of the chamber 6 of the heat treatment apparatus 1 in the third preferred embodiment is similar to that in the first preferred embodiment.

In the third preferred embodiment, the pressure in the chamber 6 is reduced once to the pressure P1 lower than atmospheric pressure and then returned to the pressure P3 by supplying the nitrogen gas into the chamber 6, so that an oxygen concentration of not greater than approximately 200 ppb in the heat treatment space 65 of the chamber 6 during the heat treatment for the formation of the silicide is achieved as in the first preferred embodiment. This suppresses the increase in resistance of the silicide resulting from the entry of oxygen in the heat treatment space 65 into the defects near the interface between the metal film 108 and the base material 101 during the process of silicide formation. Also, the oxidation of the silicide itself is prevented.

Also, the excessive increase in the thickness of the silicide is suppressed because the temperature of the front surface of the semiconductor wafer W is increased to the treatment temperature T2 in an extremely short time by irradiating the front surface of the semiconductor wafer W with a flash of light from the flash lamps FL for a time period of less than one second, as in the first preferred embodiment.

In the third preferred embodiment, the heating treatment is performed by irradiating the front surface of the semiconductor wafer W with a flash of light, with the pressure in the chamber 6 maintained at the pressure P3 higher than atmospheric pressure, i.e. under an increased pressure. The heat treatment under an increased pressure lowers the diffusion velocity of oxygen released from the chamber side portion 61 and the like to restrain the oxygen from reaching the semiconductor wafer W.

In the third preferred embodiment, the exhaust flow rate and the supply flow rate during the pressure reduction and the pressure return in the chamber 6 are changed in a stepless and continuous manner. This prevents particles from swirling up due to abrupt changes in supplied and exhausted gas.

Fourth Preferred Embodiment

Next, a fourth preferred embodiment according to the present invention will be described. The heat treatment apparatus 1 of the fourth preferred embodiment is exactly identical in configuration with that of the first preferred embodiment. The procedure for treatment of the semiconductor wafer W in the heat treatment apparatus 1 of the fourth preferred embodiment is substantially similar to that of the first preferred embodiment. The fourth preferred embodiment differs from the first preferred embodiment in pressure changes in the chamber 6.

Figure 13:
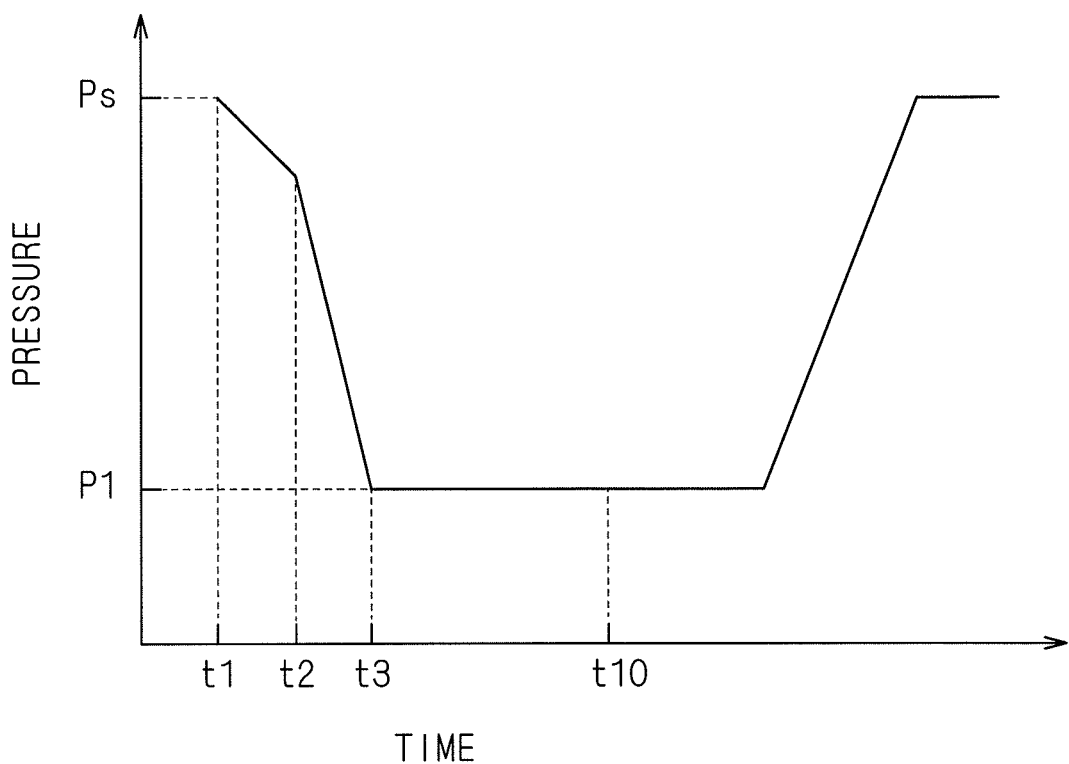
FIG. 13 is a graph showing changes in pressure in the chamber according to a fourth preferred embodiment of the present invention.

FIG. 13 is a graph showing changes in pressure in the chamber 6 according to the fourth preferred embodiment. In FIG. 13, the abscissa represents time, and the ordinate represents pressure in the chamber 6, as in FIG. 10.

At the point in time when the semiconductor wafer W with the metal film 108 deposited thereon is received in the chamber 6 and the transport opening 66 is closed, the pressure in the chamber 6 is equal to the ordinary pressure Ps (=atmospheric pressure=approximately 101325 Pa), as in the first preferred embodiment. Then, the reduction in pressure in the chamber 6 starts at the time t1. After the gas is exhausted at a low exhaust flow rate in the early stage of the pressure reduction, the exhaust flow rate is changed to a higher exhaust flow rate at the time t2, and the gas is exhausted at the higher exhaust flow rate, as in the first preferred embodiment. This prevents particles in the chamber 6 from swirling up.

At the time t3 when the pressure in the chamber 6 reaches the pressure P1, the valve 89 for exhausting the gas is closed. In the fourth preferred embodiment, the pressure in the chamber 6 is maintained at the pressure P1 without introducing the nitrogen gas into the chamber 6. The valve 89 may be opened to continue exhausting the gas for the purpose of maintaining the pressure in the chamber 6 at the pressure P1.

In the fourth preferred embodiment, the pressure in the chamber 6 is reduced to the pressure P1 and is thereafter maintained at the pressure P1. This achieves a residual oxygen concentration of not greater than approximately 200 ppb in the chamber 6. While the pressure in the chamber 6 is maintained at the pressure P1, the preheating of the semiconductor wafer W is performed by the halogen lamps HL, and the flash heating is thereafter performed at time t10 by irradiating the front surface of the semiconductor wafer W with a flash of light from the flash lamps FL. The details of the preheating and the flash heating treatment in the fourth preferred embodiment are identical with those in the first preferred embodiment. By irradiating the front surface of the semiconductor wafer W with the flash of light from the flash lamps FL, silicon in the source/drain regions and the metal film 108 react with each other to form a silicide.

After a predetermined time period has elapsed since the completion of the flash heating treatment, the valve 84 for supplying the gas is opened, so that the nitrogen gas is supplied from the gas supply source 85 into the chamber 6 to return the pressure in the chamber 6 to the ordinary pressure Ps. The halogen lamps HL turn off. This causes the temperature of the semiconductor wafer W to decrease from the preheating temperature T1. The procedure for the subsequent transport of the semiconductor wafer W the temperature of which is decreased to a predetermined temperature out of the chamber 6 of the heat treatment apparatus 1 in the fourth preferred embodiment is similar to that in the first preferred embodiment.

In the fourth preferred embodiment, the pressure in the chamber 6 is reduced once to the pressure P1 lower than atmospheric pressure and then maintained at the pressure P1, so that an oxygen concentration of not greater than approximately 200 ppb in the heat treatment space 65 of the chamber 6 during the heat treatment for the formation of the silicide is achieved as in the first preferred embodiment. This suppresses the increase in resistance of the silicide resulting from the entry of oxygen in the heat treatment space 65 into the defects near the interface between the metal film 108 and the base material 101 during the process of silicide formation. Also, the oxidation of the silicide itself is prevented.

Also, the excessive increase in the thickness of the silicide is suppressed because the temperature of the front surface of the semiconductor wafer W is increased to the treatment temperature T2 in an extremely short time by irradiating the front surface of the semiconductor wafer W with a flash of light from the flash lamps FL for a time period of less than one second, as in the first preferred embodiment.

The heat treatment of the semiconductor wafer W is performed under a reduced pressure in the fourth preferred embodiment to produce effects similar to those of the second preferred embodiment. Further, if the metal film 108 is made of titanium, there is a danger that the metal film 108 is nitrided when the heat treatment is performed in a nitrogen atmosphere. However, the heat treatment of the semiconductor wafer W under an extremely low pressure as in the fourth preferred embodiment suppresses the nitriding of the metal film 108.

Modifications

While the preferred embodiments according to the present invention have been described hereinabove, various modifications of the present invention in addition to those described above may be made without departing from the scope and spirit of the invention. For example, the pressure P1 that is the pressure to be attained during the pressure reduction in the chamber 6 is approximately 100 Pa in the aforementioned preferred embodiments, but is not limited to this. The pressure P1 may take any appropriate value. To decrease the oxygen concentration to be attained in the chamber 6 to approximately one tenth, it is sufficient that the pressure P1 that is the pressure to be attained during the pressure reduction in the chamber 6 is approximately one tenth (approximately 10000 Pa) of atmospheric pressure. Making the pressure P1 lower (i.e., reducing the pressure to a higher vacuum) achieves the lower oxygen concentration remaining in the chamber 6 after the pressure return, but requires longer time to reduce the pressure to the pressure P1. It is therefore preferable that the pressure P1 is set in consideration for a balance between the oxygen concentration required for the execution of the heat treatment for silicide formation and the throughput.

In the aforementioned preferred embodiments, the three bypass lines 197, 198 and 199 are provided to control the exhaust flow rate from the chamber 6. However, the number of bypass lines may be not less than one. The exhaust flow rate from the chamber 6 may be controlled by providing a throttle valve or a gas ballast in place of providing the plurality of bypass lines 197, 198 and 199. Also, a mass flow controller may be used in place of the flow regulating valves 90 and 196.

The exhaust flow rate from the chamber 6 during the pressure reduction is changed in two levels in the first and second preferred embodiments, and the exhaust flow rate is increased in a stepless and continuous manner in the third preferred embodiment. The present invention, however, is not limited to these. For example, the exhaust flow rate may be changed in multiple levels. That is, it is only necessary that the exhaust flow rate during the reduction in pressure in the chamber 6 is increased with time.

Similarly, the supply flow rate to the chamber 6 during the pressure return is increased in a stepless and continuous manner in the third preferred embodiment. However, the supply flow rate to the chamber 6 during the pressure return may be changed in two levels or in multiple levels to increase. That is, it is only necessary that the supply flow rate during the return of pressure in the chamber 6 is increased with time.

For the reduction and return of the pressure in the chamber 6, the controller 3 may control the valves and the like based on the amount of time elapsed from the start (the time t1) of the pressure reduction or may effect feedback control of the valves and the like based on the result of measurement of the pressure in the heat treatment space 65 by means of the pressure gauge 180. For the control based on the elapsed time, a relationship between the elapsed time and the pressure in the chamber 6 should be determined by experiment or by simulation.

In the aforementioned preferred embodiments, the silicide is formed by depositing the metal film 108 on the base material 101 of silicon. The base material 101, however, need not be made of silicon, but may be made of germanium (Ge) or silicon-germanium. In particular, silicon-germanium is used as the base material 101 for the manufacture of PMOS transistors. When the base material 101 is made of germanium or silicon-germanium, the metal film 108 is deposited on the base material 101, so that germanium and the metal react with each other to form a germanide. The treatment performed on the semiconductor wafer W is similar to that in the aforementioned preferred embodiments even when the base material 101 is made of germanium or silicon-germanium.

The aforementioned preferred embodiments are intended to suppress the increase in resistance of the silicide. The technique according to the present invention, however, may be applied to the reduction in contact resistance in a Fin structure. In the Fin structure, a metal film (for example, a film of TiN) for the formation of a contact is deposited on a partial region (the opening of a contact hole) of the base material 101. The technique according to the present invention may be applied to the formation of a contact (ohmic contact) between the metal film and the base material 101 to perform heat treatment at an extremely low oxygen concentration, thereby reducing the contact resistance.

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided so long as the halogen lamps HL are arranged in upper and lower tiers.

Also, in the aforementioned preferred embodiments, the semiconductor wafer W is preheated by irradiating the semiconductor wafer W with halogen light from the halogen lamps HL. The technique for preheating is not limited to this, but the semiconductor wafer W may be preheated by placing the semiconductor wafer W on a hot plate.

While the invention has been described in detail, the foregoing description is in all aspects illustrative and not restrictive. It is understood that numerous other modifications and variations can be devised without departing from the scope of the invention.

What is claimed is:

1. A method of irradiating a substrate with a flash of light to form a silicide or a germanide, comprising the steps of:
    (a) transporting a substrate with a metal film deposited thereon into a chamber;
    (b) reducing the pressure in said chamber to a first pressure lower than atmospheric pressure;
    (c) returning the pressure in said chamber from the first pressure to a second pressure higher than the first pressure; and
    (d) irradiating a front surface of said substrate with a flash of light from a flash lamp while maintaining the pressure in said chamber at the second pressure.

2. The method according to claim 1, wherein
the second pressure is higher than the first pressure and lower than atmospheric pressure.

3. The method according to claim 1, wherein
the second pressure is equal to atmospheric pressure.

4. The method according to claim 1, wherein
the second pressure is higher than atmospheric pressure.

5. The method according to claim 1, wherein
an exhaust flow rate from said chamber is increased with time in said step (b).

6. The method according to claim 1, wherein
a supply flow rate to said chamber is increased with time in said step (c).

7. The method according to claim 1, wherein
an inert gas is caused to flow at a flow rate ranging from 50 to 100 liters per minute in said chamber, with the pressure in said chamber maintained at atmospheric pressure, after said step (d).

8. The method according to claim 1, wherein
an inert gas is supplied into said chamber while a transport opening of said chamber is opened in said step (a).

* * * * *